(12) United States Patent
Maetani et al.

(10) Patent No.: US 12,424,859 B2
(45) Date of Patent: Sep. 23, 2025

(54) CHARGE CONTROL CIRCUIT, CHARGE CONTROL DEVICE, AND BATTERY DEVICE

(71) Applicant: ABLIC Inc., Tokyo (JP)

(72) Inventors: Fumihiko Maetani, Tokyo (JP); Hiroshi Saito, Tokyo (JP)

(73) Assignee: ABLIC Inc., Nagano (JP)

( * ) Notice: Subject to any disclaimer, the term of this patent is extended or adjusted under 35 U.S.C. 154(b) by 673 days.

(21) Appl. No.: 17/844,060

(22) Filed: Jun. 20, 2022

(65) Prior Publication Data
US 2023/0006459 A1    Jan. 5, 2023

(30) Foreign Application Priority Data

Jun. 30, 2021    (JP) .................. 2021-108783

(51) Int. Cl.
*H02J 7/00*    (2006.01)
*G01R 31/3835*    (2019.01)
*G01R 31/396*    (2019.01)
*H01M 10/44*    (2006.01)
*H01M 10/46*    (2006.01)
(Continued)

(52) U.S. Cl.
CPC ...... *H02J 7/00308* (2020.01); *G01R 31/3835* (2019.01); *G01R 31/396* (2019.01); *H01M 10/441* (2013.01); *H01M 10/46* (2013.01); *H01M 10/482* (2013.01); *H01M 50/204* (2021.01); *H01M 50/296* (2021.01); *H01M 50/51* (2021.01); *H01M 50/583* (2021.01); *H02J 7/0013* (2013.01); *H02J 7/0036* (2013.01); *H02J 7/007* (2013.01); *H01M 2200/103* (2013.01)

(58) Field of Classification Search
CPC .. H02J 7/00308; H02J 7/00304; H02J 7/0036; H02H 7/18; H02H 3/021; H02H 9/001; H02H 3/087; H01M 50/51
USPC ........................................................ 320/116
See application file for complete search history.

(56) References Cited

U.S. PATENT DOCUMENTS 5,578,914 A * 11/1996 Morita .................. H02J 7/0016
320/164
5,581,170 A * 12/1996 Mammano ............ H02J 7/0019
320/163
(Continued)

FOREIGN PATENT DOCUMENTS

JP    2015053780    3/2015

*Primary Examiner* — Julian D Huffman
*Assistant Examiner* — Ryu-Sung P. Weinmann
(74) *Attorney, Agent, or Firm* — JCIPRNET

(57) ABSTRACT

The charge control circuit includes a cell connection detection circuit monitoring a voltage between input ports to which terminals of a cell pack are connected, an overvoltage detection circuit monitoring an overvoltage of the secondary cells, a first latch circuit receiving a signal output by the cell connection detection circuit, a second latch circuit receiving a signal output by the overvoltage detection circuit, a reset circuit outputting a signal to the first latch circuit and the second latch circuit when the charge control circuit is activated, and a control circuit receiving a signal output from the second latch circuit and outputting a signal for protecting the cell pack from the overvoltage. The control circuit does not output a signal for blowing the fuse until the first latch circuit receives a detection signal of the cell connection detection circuit.

10 Claims, 4 Drawing Sheets

(51) Int. Cl.
H01M 10/48 (2006.01)
H01M 50/204 (2021.01)
H01M 50/296 (2021.01)
H01M 50/51 (2021.01)
H01M 50/583 (2021.01)

(56) References Cited

U.S. PATENT DOCUMENTS

| | | | | |
|---|---|---|---|---|
| 5,965,996 A | * | 10/1999 | Arledge | B60L 58/22 320/116 |
| 6,373,225 B1 | * | 4/2002 | Haraguchi | H02J 7/0016 320/122 |
| 2014/0210612 A1 | * | 7/2014 | Shibata | G01R 31/396 340/521 |

* cited by examiner

CHARGE CONTROL CIRCUIT, CHARGE CONTROL DEVICE, AND BATTERY DEVICE

CROSS-REFERENCE TO RELATED APPLICATION

This application claims the priority benefits of Japanese application no. 2021-108783, filed on Jun. 30, 2021. The entirety of the above-mentioned patent application is hereby incorporated by reference herein and made a part of this specification.

BACKGROUND

Technical Field

The present invention relates to a charge control circuit, a charge control device, and a battery device, and more particularly relates to a protection circuit.

Description of Related Art

FIG. 4 is a battery device including a conventional protection circuit. The battery device of FIG. 4 includes a cell pack 42 in which a plurality of secondary cells are connected in series, a voltage monitoring IC 41 which detects an overvoltage of each secondary cell, a MOS transistor 43 which is a protection circuit for cutting off a charge path in case of an abnormal overvoltage of the secondary cell, a resistor 44, and a fuse 45.

The conventional battery device turns on the MOS transistor 43 when the voltage monitoring IC 41 detects an abnormal voltage of any of the secondary cells, and blows the fuse 45 with heat generated by the resistor 44. By cutting off the charge path in this way when the secondary cell has an abnormal overvoltage, the safety of an electronic device connected to the secondary cells can be ensured.

When the battery device including the conventional protection circuit is assembled, each terminal of the cell pack in which a plurality of secondary cells are connected in series is connected to each input port of the protection circuit. At this time, if the terminals/ports are not connected in the designated order or if the terminals/ports are not properly connected, there is a possibility that the voltage monitoring IC 41 may erroneously detect an overvoltage and blow the fuse 45.

SUMMARY

The present invention provides a charge control circuit, a charge control device, and a battery device which prevent the protection circuit from erroneously blowing the fuse during assembly.

The charge control circuit in accordance with an embodiment of the present invention is a charge control circuit for protecting a cell pack in which a plurality of secondary cells are connected in series by blowing a fuse in a charge path. The charge control circuit includes: a plurality of input ports to which a positive electrode terminal, a plurality of intermediate terminals, and a negative electrode terminal of the cell pack are connected; a cell connection detection circuit which is connected to the plurality of input ports, and detects that all terminals of the cell pack are connected to the plurality of input ports by monitoring a voltage between the input ports; an overvoltage detection circuit which is connected to the plurality of input ports, and monitors an overvoltage of the plurality of secondary cells; a first latch circuit which receives a signal output by the cell connection detection circuit; a second latch circuit which receives a signal output by the overvoltage detection circuit; a reset circuit which outputs a signal to the first latch circuit and the second latch circuit when the charge control circuit is activated; and a control circuit which receives a signal output by the second latch circuit, and outputs a signal for protecting the cell pack from the overvoltage. The control circuit does not output a signal for blowing the fuse until the first latch circuit receives a detection signal of the cell connection detection circuit.

Since the charge control circuit in accordance with an embodiment of the present invention includes the cell connection detection circuit, it is possible to prevent the protection circuit from erroneously detecting an overvoltage of the secondary cell during assembly.

DESCRIPTION OF THE EMBODIMENTS

Hereinafter, a battery device including a charge control circuit of the present invention will be described with reference to the drawings.

Figure 1:
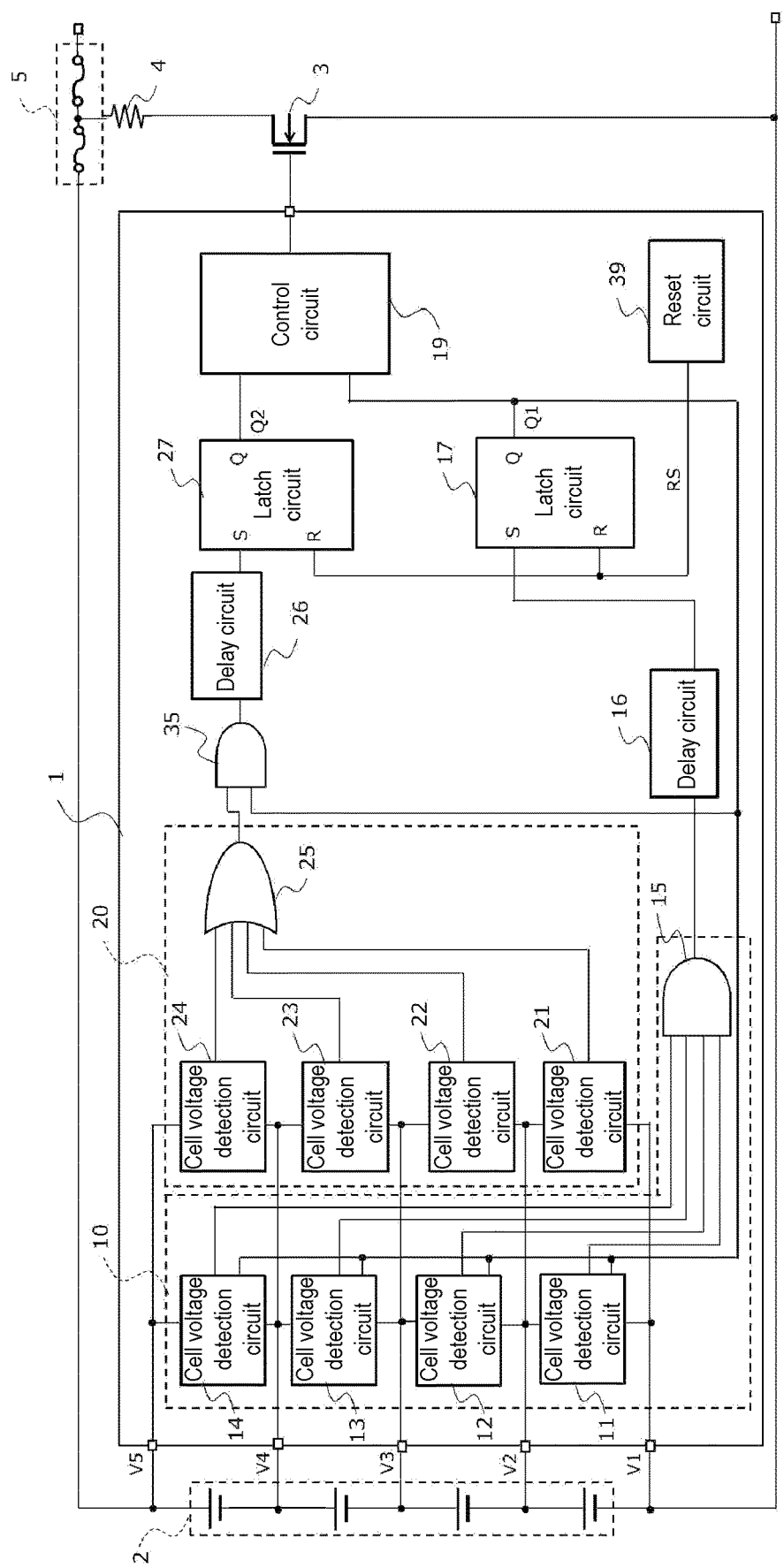
FIG. 1 is a block diagram illustrating the battery device including the charge control circuit according to the present embodiment.

FIG. 1 is a block diagram illustrating the battery device including the charge control circuit according to the present embodiment. In the battery device of FIG. 1, the charge control circuit 1 is, for example, a semiconductor device which monitors the voltage of each of four series-connected secondary cells of a cell pack 2, and blows a fuse circuit 5 when detecting an overvoltage to protect an electronic device connected between the secondary cells and an external terminal.

The battery device including the charge control circuit of FIG. 1 includes the charge control circuit 1, the cell pack 2 in which a plurality of secondary cells are connected in series, a NMOS transistor 3, a resistor 4, the fuse circuit 5, and external terminals. The charge control circuit 1 includes a cell connection determination circuit 10, an overvoltage detection circuit 20, a delay circuit 16, a latch circuit 17, an AND circuit 35, a delay circuit 26, a latch circuit 27, a control circuit 19, and a reset circuit 39. The cell connection determination circuit 10 includes cell voltage detection circuits 11 to 14 connected in series and an AND circuit 15. The overvoltage detection circuit 20 includes cell voltage detection circuits 21 to 24 connected in series and an OR circuit 25. The reset circuit 39 is composed of, for example, a UVLO circuit or a POC circuit, and outputs 1-shot pulse at the H level (voltage high level) when the secondary cells are connected to the input port and a voltage is applied to the charge control circuit 1 to activate the charge control circuit 1. The cell pack 2 includes a positive electrode terminal, three intermediate terminals, and a negative electrode terminal.

In the charge control circuit 1, the input ports V1 to V5 are connected to five output ports of the cell pack 2, and the output ports are connected to the gate terminal of the NMOS transistor 3. The fuse circuit 5 is connected to a charge path between one external terminal and the cell pack 2, and the control terminal is connected to the drain terminal of the NMOS transistor 3 via the resistor 4. The source terminal of the NMOS transistor 3 is connected to the other external terminal.

In the cell voltage detection circuit 11, the input port is connected to the input ports V1 and V2, and the output port is connected to the input port of the AND circuit 15. In the cell voltage detection circuit 12, the input port is connected to the input ports V2 and V3, and the output port is connected to the input port of the AND circuit 15. In the cell voltage detection circuit 13, the input port is connected to the input ports V3 and V4, and the output port is connected to the input port of the AND circuit 15. In the cell voltage detection circuit 14, the input port is connected to the input ports V4 and V5, and the output port is connected to the input port of the AND circuit 15.

In the cell voltage detection circuit 21, the input port is connected to the input ports V1 and V2, and the output port is connected to the input port of the OR circuit 25. In the cell voltage detection circuit 22, the input port is connected to the input ports V2 and V3, and the output port is connected to the input port of the OR circuit 25. In the cell voltage detection circuit 23, the input port is connected to the input ports V3 and V4, and the output port is connected to the input port of the OR circuit 25. In the cell voltage detection circuit 24, the input port is connected to the input ports V4 and V5, and the output port is connected to the input port of the OR circuit 25.

The output port of the AND circuit 15 is connected to the input port of the delay circuit 16. In the latch circuit 17, the output port of the delay circuit 16 is connected to the set terminal S, the output port of the reset circuit 39 is connected to the reset terminal R, and the output port Q is connected to the first input port of the control circuit 19. The output port of the OR circuit 25 is connected to the input port of the AND circuit 35. In the AND circuit 35, the other input port is connected to the output port Q of the latch circuit 17, and the output port is connected to the input port of the delay circuit 26. In the latch circuit 27, the output port of the delay circuit 26 is connected to the set terminal S, the output port of the reset circuit 39 is connected to the reset terminal R, and the output port Q is connected to the second input port of the control circuit 19. The output port of the control circuit 19 is connected to the output port of the charge control circuit 1. The control circuit 19 outputs a signal at the H level to the output port when the first input port and the second input port receive the signals Q1 and Q2 at the H level.

The battery device including the charge control circuit 1 configured as described above operates as follows. Here, in the cell voltage detection circuits 21 to 24 of the overvoltage detection circuit 20, the detection voltage is set to an overvoltage of the secondary cell. Further, since the cell voltage detection circuits 11 to 14 of the cell connection determination circuit 10 only need to be able to detect that the secondary cells are connected, the detection voltage is set lower than the detection voltage of the overvoltage detection circuit 20, and is set to, for example, the minimum value of the voltage of the secondary cell after manufacturing.

When any terminal of the cell pack 2 is connected to the input port of the charge control circuit 1 and a voltage is applied, the reset circuit 39 is activated first and the reset signal RS is output from the output port. When the reset terminals R of the latch circuit 17 and the latch circuit 27 receive the reset signal RS, the latch circuit 17 and the latch circuit 27 output the signals Q1 and Q2 at the L level (voltage low level) from the respective output ports Q. Since the first input port and the second input port of the control circuit 19 receive the signals Q1 and Q2 at the L level, the control circuit 19 outputs a signal at the L level to the output port.

In a state where the terminals of the secondary cells are not connected to all of the input ports V1 to V5 of the charge control circuit 1, the overvoltage detection circuit 20 may erroneously detect and output an overvoltage detection signal. Here, when any of the cell voltage detection circuits 21 to 24 outputs an overvoltage detection signal at the H level, the OR circuit 25 outputs an overvoltage detection signal at the H level from the output port to the input port of the AND circuit 35. Since the other input port of the AND circuit 35 receives the signal Q1 at the L level, the AND circuit 35 does not output an overvoltage detection signal at the H level. That is, the AND circuit 35 is a mask circuit for the overvoltage detection signal.

Accordingly, since the set terminals S of the latch circuit 17 and the latch circuit 27 receive a signal at the L level, the latch circuit 17 and the latch circuit 27 continue to output the signal Q1 at the L level from the output ports Q. Accordingly, since the control circuit 19 outputs a signal at the L level to the output port, the fuse circuit 5 is not blown erroneously.

Next, when the terminals of the secondary cells are connected to all of the input ports V1 to V5 of the charge control circuit 1, in the cell connection determination circuit 10, all of the cell voltage detection circuits 11 to 14 output a detection signal at the H level. Since all the input signals are at the H level, the AND circuit 15 outputs a signal at the H level. Since the set terminal S of the latch circuit 17 receives a signal at the H level via the delay circuit 16, the latch circuit 17 outputs the signal Q1 at the H level from the output port Q.

The input port of the AND circuit 35 and the first input port of the control circuit 19 receive the signal Q1 at the H level. The AND circuit 35 can output the overvoltage detection signal at the H level output by the OR circuit 25 here. Further, since the first input port of the control circuit 19 receives the signal Q1 at the H level, when the second input port receives the signal Q2 at the H level, which is an overvoltage detection signal, the control circuit 19 outputs a signal at the H level from the output port to blow the fuse circuit 5.

In addition, the cell voltage detection circuits 11 to 14 of the cell connection determination circuit 10 receive the signal Q1 output by the latch circuit 17. The cell voltage detection circuits 11 to 14 are configured to stop the operation when the signal Q1 is at the H level. Accordingly, in the charge control circuit 1, when the terminals of the secondary cells are connected to all of the input ports V1 to V5, the cell connection determination circuit 10 can stop the operation and reduce the current consumption.

As described above, the battery device including the charge control circuit of FIG. 1 includes the cell connection determination circuit 10 for detecting that all the secondary cell terminals are connected, and therefore can prevent the fuse circuit 5 from being erroneously blown even if the overvoltage detection circuit 20 erroneously detects in the assembly process.

Figure 2:
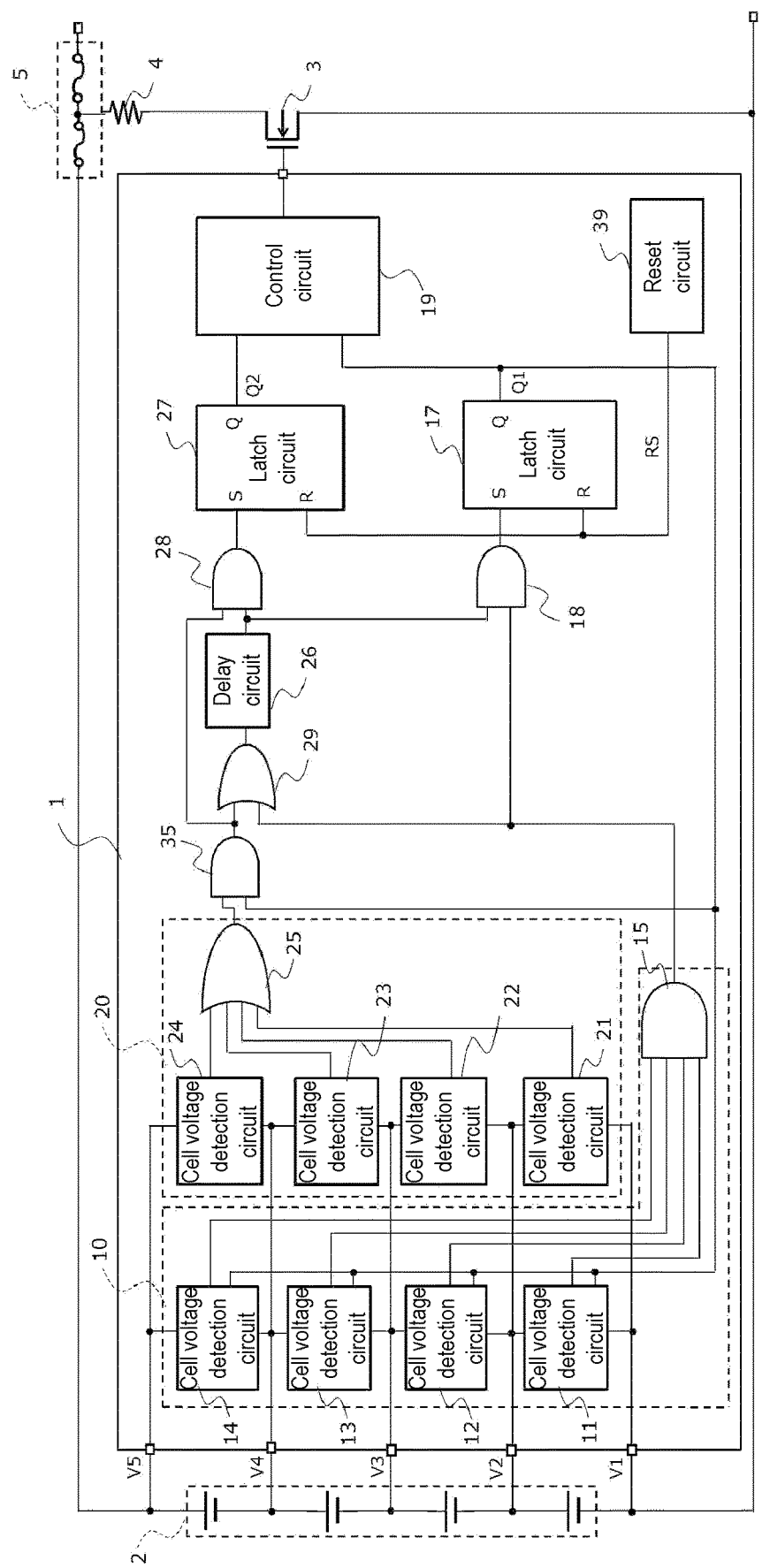
FIG. 2 is a block diagram illustrating the battery device including the charge control circuit according to another example of the present embodiment.

FIG. 2 is a block diagram illustrating a battery device including a charge control circuit according to another example of the present embodiment. The charge control circuit 1 of FIG. 2 includes an OR circuit 29 for inputting a detection signal, and an AND circuit 18 and an AND circuit 28 for separating a delay signal by sharing the delay circuit 16 and the delay circuit 26 in the charge control circuit 1 of FIG. 1. Since other circuit configurations and operations are the same as those of the charge control circuit 1 of FIG. 1, the description thereof will be omitted.

The charge control circuit 1 configured as illustrated in FIG. 2 can reduce the circuit scale by sharing the delay circuits.

Figure 3:
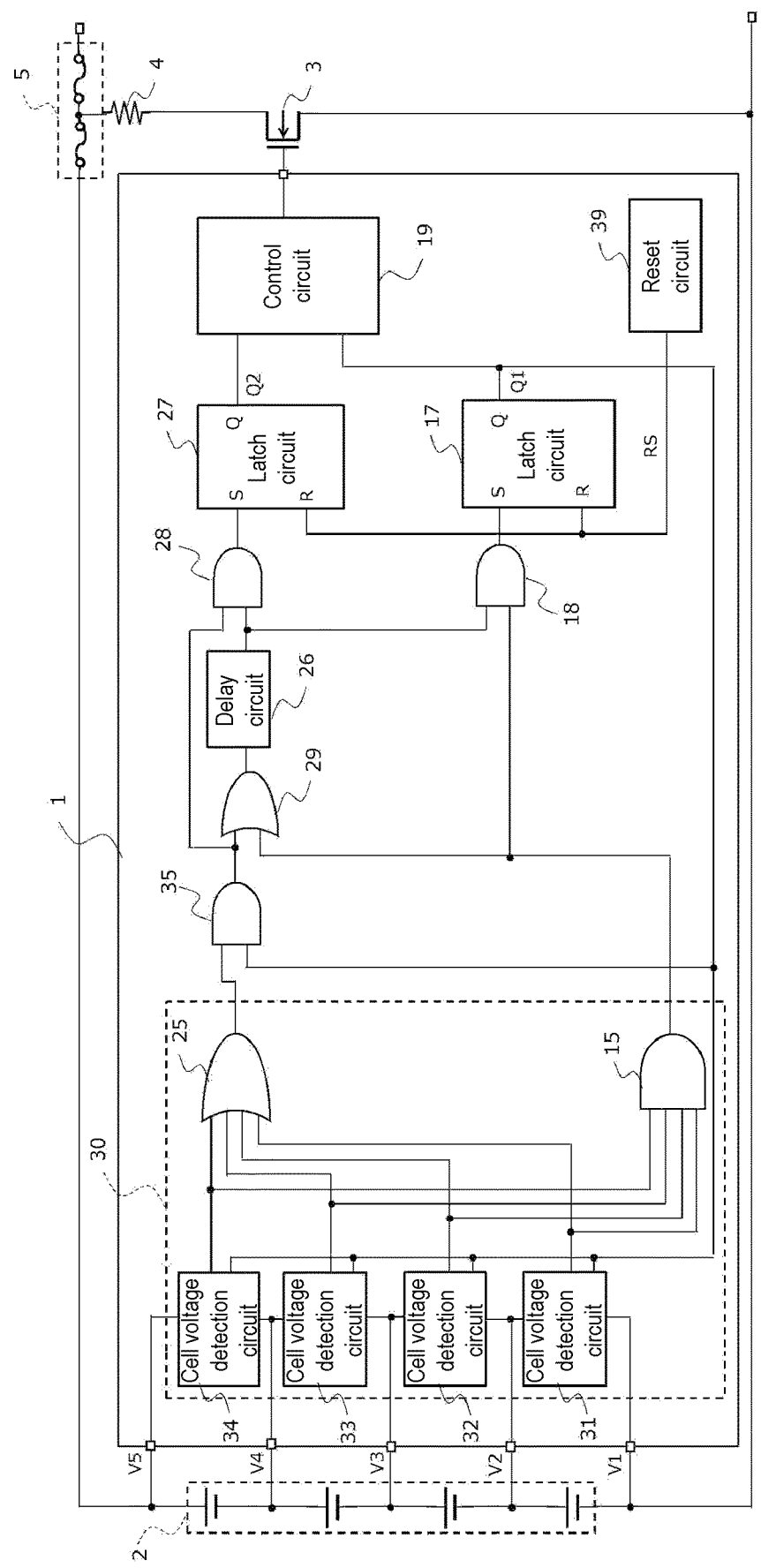
FIG. 3 is a block diagram illustrating the battery device including the charge control circuit according to another example of the present embodiment.
Figure 4:
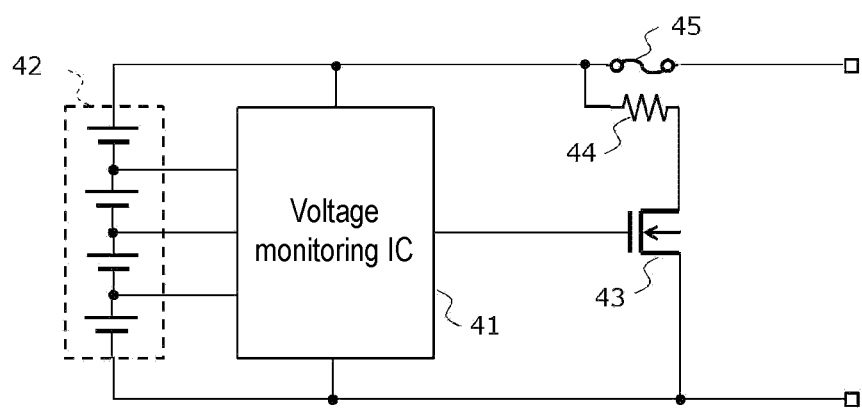
FIG. 4 is a block diagram illustrating the battery device including the conventional protection circuit.

FIG. 3 is a block diagram illustrating a battery device including a charge control circuit according to another example of the present embodiment. In place of the cell connection determination circuit 10 and the overvoltage detection circuit 20 in the charge control circuit 1 of FIG. 2, the charge control circuit 1 of FIG. 3 includes a detection circuit 30 which has their functions. The detection circuit 30 includes cell voltage detection circuits 31 to 34 connected in series. The detection circuit 30 is configured to change the threshold value of voltage detection according to the level of the output port Q of the latch circuit 17. Since other circuit configurations are the same as those of the charge control circuit 1 of FIG. 2, the description thereof will be omitted.

The battery device including the charge control circuit 1 configured as described above operates as follows. When any terminal of the cell pack 2 is connected to the input port of the charge control circuit 1 and a voltage is applied, the reset circuit 39 is activated first and the reset signal RS is output from the output port. When the reset terminals R of the latch circuit 17 and the latch circuit 27 receive the reset signal RS, the latch circuit 17 and the latch circuit 27 output the signals Q1 and Q2 at the L level from the respective output ports Q. Since the first input port and the second input port of the control circuit 19 receive the signals Q1 and Q2 at the L level, the control circuit 19 outputs a signal at the L level to the output port.

The detection circuit 30 is set to function as a cell connection determination circuit when the signal Q1 is at the L level. Accordingly, since any of the cell voltage detection circuits 31 to 34 outputs a detection signal at the H level, the OR circuit 25 outputs a signal at the H level to the AND circuit 35. Since the other input port of the AND circuit 35 receives the signal Q1 at the L level, the output maintains the L level.

When the terminals of the secondary cells are connected to all of the input ports V1 to V5 of the charge control circuit 1, in the detection circuit 30, all of the cell voltage detection circuits 31 to 34 output a detection signal at the H level. Since all the input signals are at the H level, the AND circuit 15 outputs a signal at the H level. The set terminal S of the latch circuit 17 receives the signal at the H level of the AND circuit 15 via the OR circuit 29, the delay circuit 26, and the AND circuit 18. Accordingly, the latch circuit 17 outputs the signal Q1 at the H level from the output port Q.

The detection circuit 30 is set to function as an overvoltage detection circuit when the signal Q1 is at the H level. Since the input port of the AND circuit 35 receives the signal Q1 at the H level, when the signal at the H level is received from the OR circuit 25, the AND circuit 35 outputs a signal at the H level. Accordingly, when the detection circuit 30 detects an overvoltage of any of the secondary cells, the AND circuit 35 outputs a signal at the H level.

The set terminal S of the latch circuit 27 receives the signal at the H level of the AND circuit 35 via the OR circuit 29, the delay circuit 26, and the AND circuit 28. Accordingly, the latch circuit 27 outputs the signal Q2 at the H level from the output port Q.

Since the first input port of the control circuit 19 receives the signal Q1 at the H level, when the second input port receives the signal Q2 at the H level which is an overvoltage detection signal, a signal at the H level is output from the output port to blow the fuse circuit 5.

As described above, the battery device including the charge control circuit of FIG. 3 includes the detection circuit 30 which functions as a cell connection determination circuit or an overvoltage detection circuit depending on the level of the signal Q1, and therefore can reduce the circuit scale while providing the same functions.

Although the embodiment of the present invention has been described above, the present invention is not limited to the above embodiment, and it is possible to make various modifications without departing from the spirit of the present invention. For example, the logic and connection relations such as the setting/resetting and output of the latch circuit are design matters and thus are not limited to this circuit.

In addition, although it is illustrated that the AND circuit 35 is connected to the output port of the OR circuit 25, the configuration is not limited thereto if it satisfies that the latch circuit 27 is not erroneously set until the latch circuit 17 is set. For example, the latch circuit 27 may receive an inverted signal of the signal of the output port Q of the latch circuit 17 at the reset terminal R. Further, the control circuit 19 may not output a signal for blowing the fuse from the output port until the signal Q1 at the H level of the latch circuit 17 is received. In that case, the control circuit 19 may be configured to reset the latch circuit 27 when receiving the signal Q1 at the H level.

Furthermore, the control circuit 19 may not be connected to the output port Q of the latch circuit 17 if not required. Further, the charge control circuit 1 of FIG. 1 may not include the delay circuit 16 if it is not required to delay the output signal of the AND circuit 15. Similarly, in the charge control circuit 1 of FIG. 3, the set terminal S of the latch circuit 17 may directly receive the output of the AND circuit 15. In that case, the AND circuits 18 and 28 and the OR circuit 29 are unnecessary.

What is claimed is:

1. A charge control circuit for protecting a cell pack in which a plurality of secondary cells are connected in series by blowing a fuse in a charge path, the charge control circuit comprising:
    a plurality of input ports to which a positive electrode terminal, a plurality of intermediate terminals, and a negative electrode terminal of the cell pack are connected;
    a cell connection detection circuit which is connected to the plurality of input ports, and detects that all terminals of the cell pack are connected to the plurality of input ports by monitoring a voltage between the input ports;
    an overvoltage detection circuit which is connected to the plurality of input ports, and monitors an overvoltage of the plurality of secondary cells;
    a first latch circuit which receives a signal output by the cell connection detection circuit;
    a second latch circuit which receives a signal output by the overvoltage detection circuit;
    a reset circuit which outputs a signal to the first latch circuit and the second latch circuit when the charge control circuit is activated;

a control circuit which receives a signal output by the second latch circuit, and outputs a signal for protecting the cell pack from the overvoltage; and a mask circuit which is controlled by an output signal of the first latch circuit, wherein the second latch circuit receives the signal output by the overvoltage detection circuit via the mask circuit, wherein the control circuit does not output a signal for blowing the fuse until the first latch circuit receives a detection signal of the cell connection detection circuit.

2. The charge control circuit according to claim 1, wherein the cell connection detection circuit comprises:

a plurality of cell voltage detection circuits which are connected in series corresponding to the plurality of secondary cells; and an AND circuit which receives output signals of the plurality of cell voltage detection circuits.

3. The charge control circuit according to claim 1, wherein an operation stop of the cell connection detection circuit is controlled by the output signal of the first latch circuit.

4. A charge control device, comprising:

the charge control circuit according to claim 3;

a MOS transistor with a gate connected to an output port of the charge control circuit; and a fuse circuit connected to the MOS transistor.

5. A battery device, comprising:

a cell pack in which a plurality of secondary cells are connected in series; and the charge control device according to claim 4 for protecting the cell pack from an overvoltage.

6. The charge control circuit according to claim 1, wherein the cell connection detection circuit and the overvoltage detection circuit are replaced by a detection circuit which operates by switching between functions of the cell connection detection circuit and the overvoltage detection circuit with the output signal of the first latch circuit.

7. A charge control device, comprising:

the charge control circuit according to claim 6;

a MOS transistor with a gate connected to an output port of the charge control circuit; and a fuse circuit connected to the MOS transistor.

8. A battery device, comprising:

a cell pack in which a plurality of secondary cells are connected in series; and the charge control device according to claim 7 for protecting the cell pack from an overvoltage.

9. A charge control device, comprising:

the charge control circuit according to claim 1;

a MOS transistor with a gate connected to an output port of the charge control circuit; and a fuse circuit connected to the MOS transistor.

10. A battery device, comprising:

a cell pack in which a plurality of secondary cells are connected in series; and the charge control device according to claim 9 for protecting the cell pack from an overvoltage.

* * * * *